United States Patent [19]

Michaels

[11] 4,084,315
[45] Apr. 18, 1978

[54] FIXTURE FOR SOLDERING INTEGRATED CIRCUIT CHIPS TO A MULTILAYER SUBSTRATE

[75] Inventor: Mark Joseph Michaels, Glendale, Ariz.

[73] Assignee: Honeywell Information Systems Inc., Phoenix, Ariz.

[21] Appl. No.: 755,525

[22] Filed: Dec. 30, 1976

[51] Int. Cl.² .......................................... H01L 21/60
[52] U.S. Cl. ............................... 29/740; 228/44.1 A; 269/254 MW
[58] Field of Search ............... 228/44.1 A, 106, 180 R, 228/180 A; 269/266, 267, 254 MW; 29/740, 741

[56] References Cited

U.S. PATENT DOCUMENTS

| | | | |
|---|---|---|---|
| 3,669,333 | 6/1972 | Coucoulas | 228/106 X |
| 3,887,998 | 6/1975 | Hartleroad et al. | 29/740 X |
| 4,018,373 | 4/1977 | Beerwerth | 228/44.1 A |

Primary Examiner—James L. Jones, Jr.
Assistant Examiner—K. J. Ramsey

Attorney, Agent, or Firm—E. W. Hughes; W. W. Holloway, Jr.; R. T. Reiling

[57] ABSTRACT

A fixture for use in soldering a large number of integrated circuit (IC) chips to a multilayer substrate in a single reflow soldering operation. A multilayer substrate with IC chips and their leads properly positioned on the substrate is placed within the base of the fixture. The force structure portion of the fixture is positioned on the base so that force pins, which are movable with respect to the force structure, can be lowered, or moved toward the substrate to apply the weight of a force pin to each IC chip to be soldered to the substrate. The weight, or force, of a force pin forces the back metal layer of each IC chip and its leads against a chip pad and chip lead pads of the substrate. The substrate is heated to melt, or to reflow, the solder on all the chip pads and chip lead pads. After the leads and back metal layer of each chip are wetted by the solder and while the solder is molten, the force structure is moved away from the base to remove the weight of the force pins from the IC chips.

8 Claims, 8 Drawing Figures

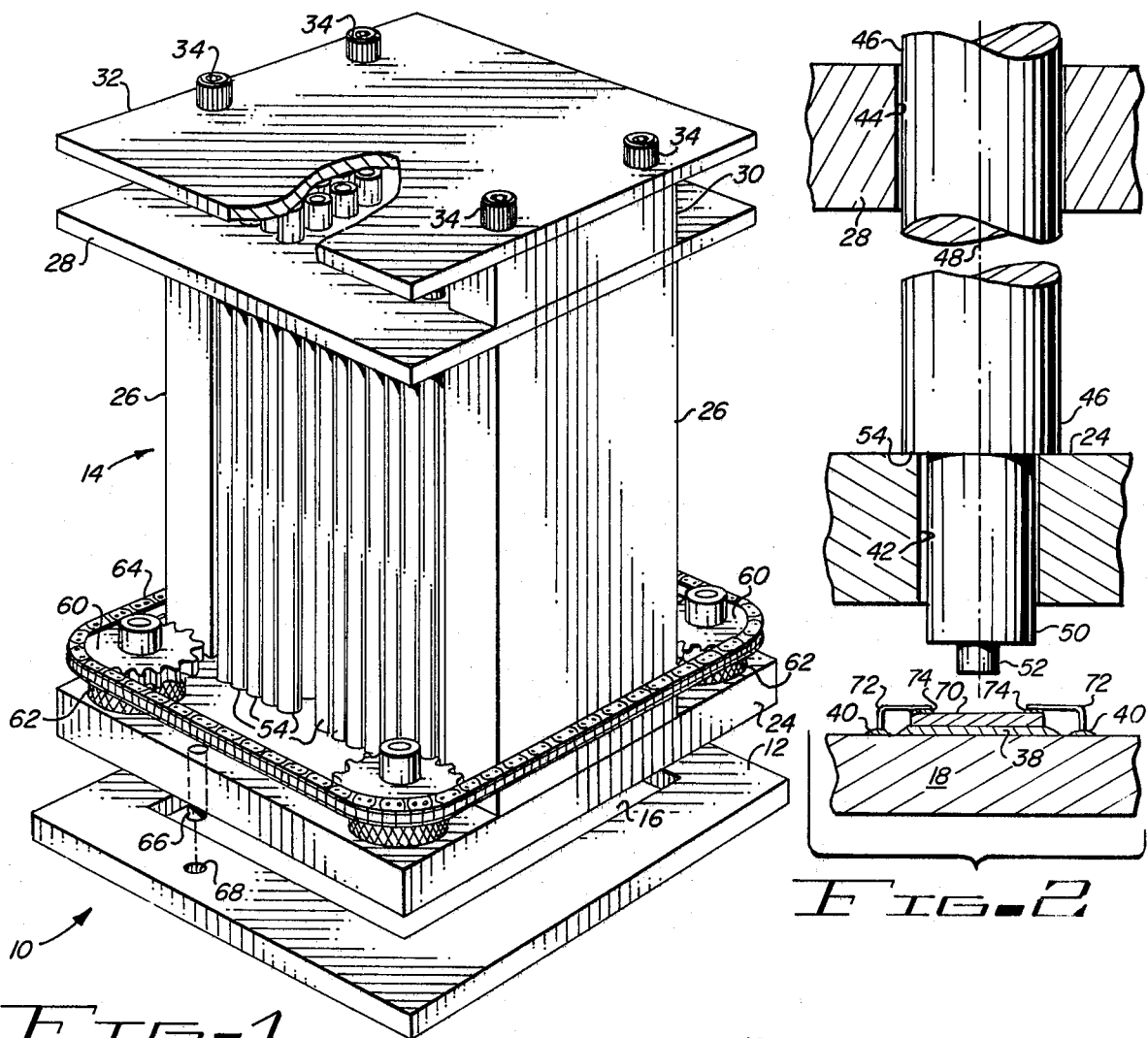
FIG-1
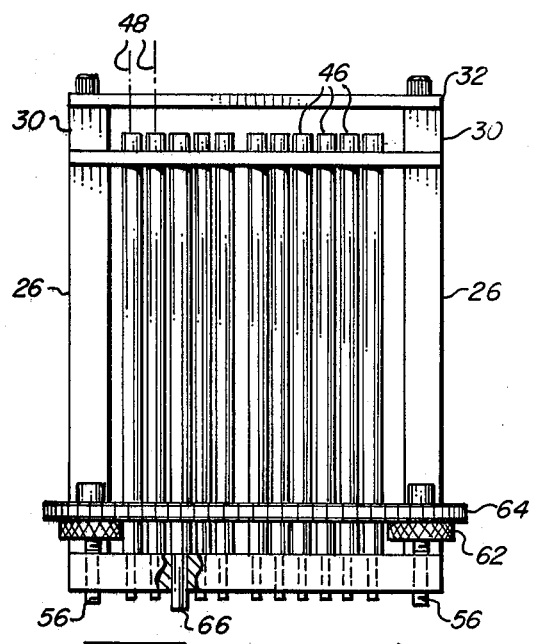
FIG-2
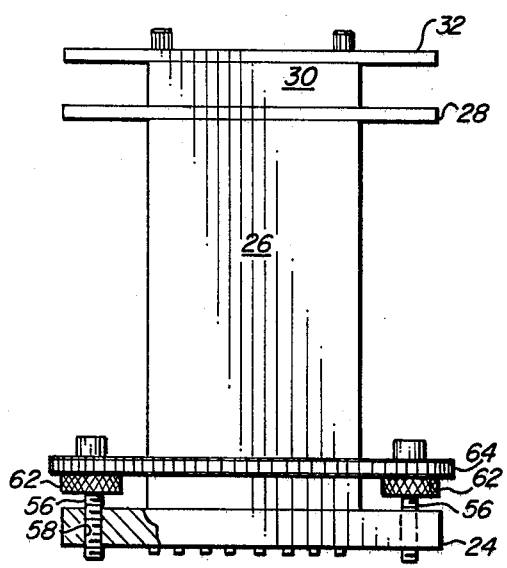
FIG-3
FIG-4

FIXTURE FOR SOLDERING INTEGRATED CIRCUIT CHIPS TO A MULTILAYER SUBSTRATE

BACKGROUND OF THE INVENTION

1. Field of the Invention

This invention is in the field of devices for applying a proper amount of force to each of a large number of medium and large scale integrated circuit (IC) chips and the leads of each chip which IC chips are properly positioned on a multilayer substrate so that such chips and their leads can be reflow soldered to chip pads and chip lead pads of a substrate in a single batch operation.

2. Description of the Prior Art

The prior art known to applicant, relevant to soldering IC chips to a multilayer substrate on which, in some examples, from 50 to 100 such IC chips are soldered has used apparatus which reflow solders one chip and its leads to a substrate at a time. With such prior art devices an operator places a chip and its preformed leads on a chip pad of the substrate so that the back metal layer of the chip overlies the chip pad and the leads of the chip are over the chip lead pads associated with each chip pad. Prior to an IC chip and its leads being reflow soldered to a chip pad and its chip lead pads, all the chip and chip lead pads of a substrate are coated with solder and the solder in turn is coated with a layer of flux. A single force pin applies its weight to only one chip to force the back metal layer of that chip and its leads toward the chip pad and chip lead pads to which the chip and its leads are to be soldered. Radiant energy is concentrated on the area of the substrate occupied by said one chip pad and its associated chip lead pads to melt, or reflow, the solder and cause the solder to wet the back metal layer and the flexible beam leads of the IC chip.

The problem with the prior art apparatus is the time and cost associated with individually placing from 50 to 100 IC chips on a substrate using the prior art apparatus. A skilled operator requires from 60 to 90 minutes to accurately position each IC chip on its chip pad and to reflow solder all of the IC chips to be soldered to a single substrate with the proper degree of reliability and accuracy. As a result, a significant amount of time is required to manufacture each such substrate using prior art apparatus and concomitantly the cost to produce one is also significant.

SUMMARY OF THE INVENTION

The present invention provides different types of fixtures which can be used to reflow solder in a batch operation all of the IC chips and their leads to a multilayer substrate in a time interval comparable with reflow soldering a single IC chip and its leads to such a substrate. In general, the devices of the present invention include a base with an aperture in which a mutilayer substrate can be accurately positioned. Prior to the substrate being placed in the base of the fixture, the chip pads and chip lead pads of the substrate are coated with solder and then a layer of suitable solder flux is applied to the solder. The IC chips and their leads are properly placed on the substrate so that the back metal layer of each IC chip overlies a chip pad and the leads of each such IC chip are in contact with, or positioned over, the chip lead pads associated with the chip pad to which each chip is to be soldered. The flux with which the pads are coated has the property of retaining each chip and its leads in their proper position on the substrate. The force structure of the fixture is then mounted on the base. The force structure has a plurality of force pins, one for each IC chip to be soldered to a given substrate. The force pins are mounted in the force structure for limited vertical movement by pin alignment means which align each force pin so that a projection of reduced diameter located at the lower end of each force pin will be substantially directly above the center of each IC chip properly placed on a substrate placed in the base of the fixture. The force structure is provided with spacing means, a plurality of lead screws threaded into bores in the force structure, the ends of which lead screws contact the base. Alignment means are incorporated in the force structure and the base, so that the force structure can easily be positioned on the base with the force pins of the force structure aligned substantially with the centers of the integrated circuit chips positioned on the substrate. The spacing means are adjusted to transfer gradually and evenly the weight of the force pins to the chips on the substrate with a minimum of forces being produced which would tend to cause a chip to move out of alignment with its chip pad. The substrate is heated to melt or reflow the solder on the pads to solder the chips and their leads to the substrate. While the solder is still in its liquid state, the spacing means is activated to remove the weight of the force pins from the IC chips. More than one mechanism is provided for varying the distance between the force structure and its base to apply the weight of the force pins to the chips and to remove the weight of the force pins from the chip without causing misalignment between the chips and their leads and the chip pads and chip lead pads to which they are to be electrically connected.

It is, therefore, an object of this invention to provide a fixture for soldering IC chips to a multilayer substrate which fixture permits reflow soldering of all of the IC chips to the substrate in a single operation.

It is a further object of this invention to provide a fixture which automates the process of manufacturing multilayer substrates by batch soldering all of the IC chips to such a substrate.

It is a further object of this invention to provide a fixture for reflow soldering IC chips to a multilayer substrate which improves the quality and reliability of the soldered connections between the chips and their leads and the substrate while reducing the time required and the costs incurred to produce such a substrate.

BRIEF DESCRIPTION OF THE DRAWINGS

Other objects, features and advantages of the invention will be readily apparent from the following description of certain preferred embodiments thereof, taken in conjunction with the accompanying drawings, although variations and modifications may be effected without departing from the spirit and scope of the novel concepts of the disclosure, and in which:

FIG. 1 is a perspective view of a fixture which can be employed for the purposes of the present invention;

FIG. 2 is a fragmentary view on an enlarged scale illustrating the relationships between a force pin, the pin alignment means, and a chip positioned on a substrate prior to the chip and its leads being soldered to the substrate;

FIG. 3 is a side elevation at a reduced scale of the force structure of the fixture of FIG. 1;

FIG. 4 is a front elevation at a reduced scale of the force structure of the fixture of FIG. 1;

DESCRIPTION OF THE PREFERRED EMBODIMENT

Figure 6:
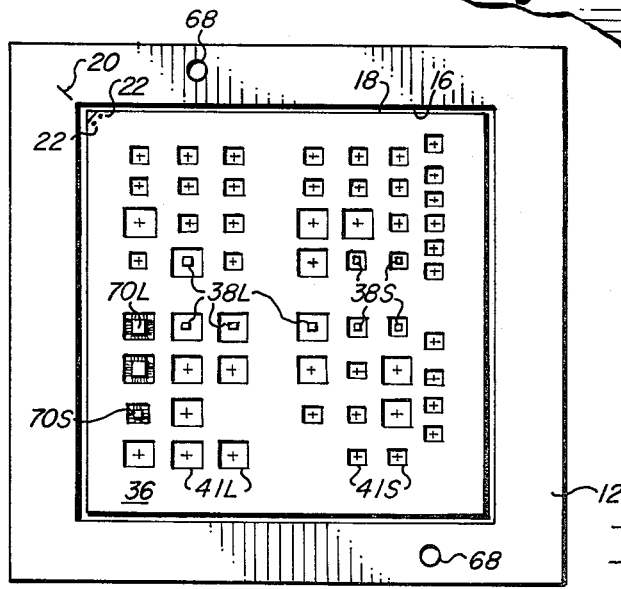
FIG. 6 is a plan view of the base of the fixture of FIG. 1 with a multilayer substrate positioned in the fixture.

In FIG. 1, fixture 10 includes a base 12 and a force structure 14. An aperture, or opening, 16 is formed in base 12 within which a multilayer substrate 18 is adapted to fit as is best illustrated in FIG. 6. Opening 16, in a preferred embodiment, is square with each of its sides being 80 millimeters in length. One corner of the top surface of base 12 is provided with a reference mark 20 into which corner the corner of substrate 18, bearing orientation marks 22, is to be placed.

In FIG. 1, force structure 14 has a lower pin alignment plate 24 to which are rigidly secured a pair of lower support columns 26. Upper pin alignment plate 28 is rigidly secured to the upper ends of lower support columns 26. A pair of upper support columns 30 are secured to the upper surface of upper pin alignment plate 28 and a back plate 32 is rigidly secured to the upper surfaces of upper support columns 30. Bolts 34, whose heads are seen in FIG. 1, for example, are threaded into threaded bores formed in lower support column 26. Lower pin alignment plate 24 is bolted to lower support columns 26 by bolts recessed in plate 24 to rigidly secure together back plate 32, upper pin alignment plate 28, lower pin alignment plate 24 and support columns 26 and 30.

Figure 7:
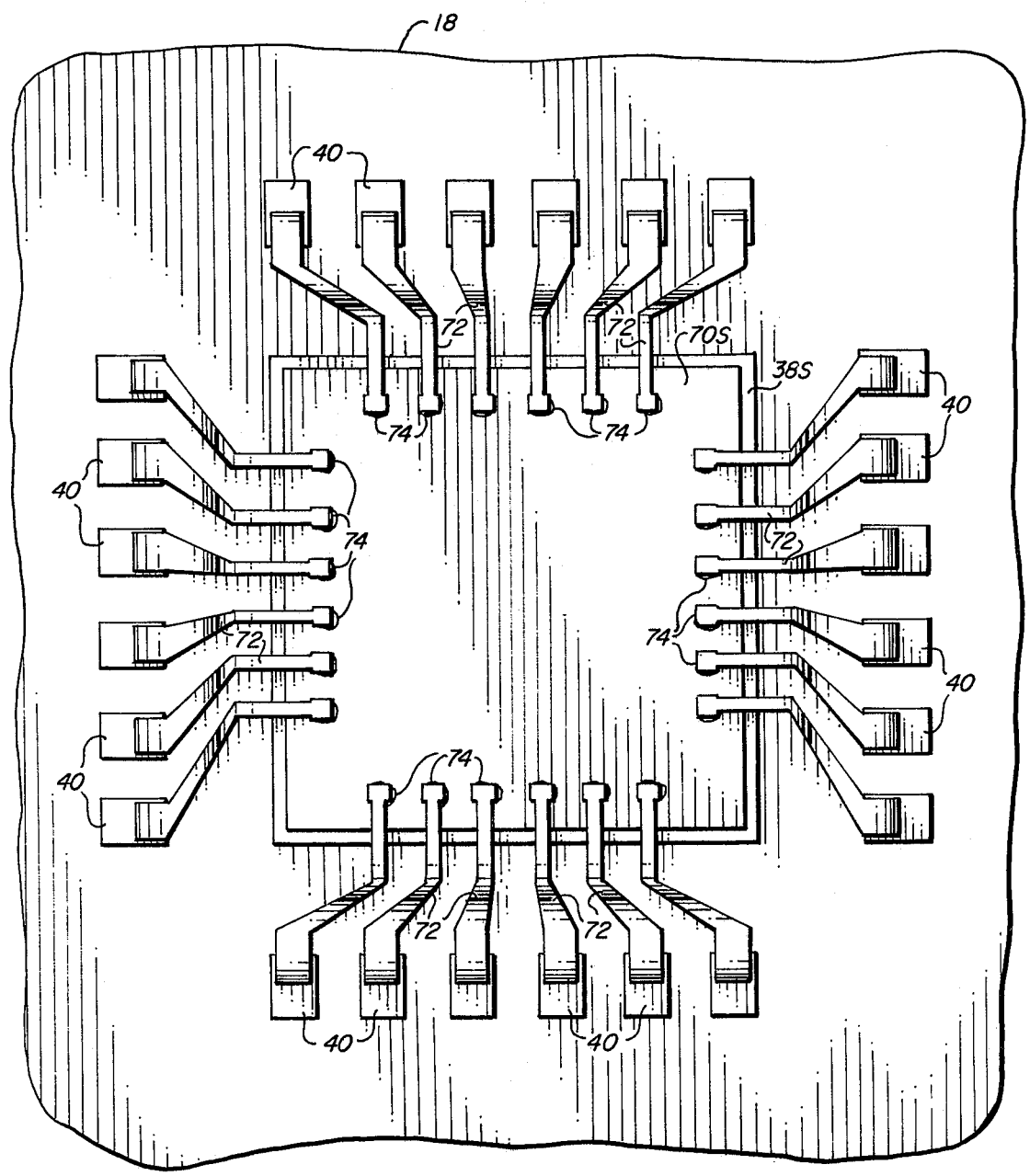
FIG. 7 is an enlarged fragmentary plan view of an IC chip mounted on a multilayer substrate.

Referring to FIG. 6, multilayer substrate 18 is positioned within aperture 16 of base 12. The upper surface 36 of substrate 18 has positioned on it a large number of chip pads 38L, 38S with pad 38L being larger than pads 38S for reasons pointed out below. In a preferred embodiment, each of the pads 38L and 38S is substantially square and, thus, have a center with each of the large pads being adapted to have a 4.0 × 4.0 mm square IC chip soldered to it and each of the small pads adapted to have a 2.0 × 2.0 mm square IC chip soldered to it. The pads 38L, 38S and their centers have a predetermined orientation and position on surface 36 of multilayer substrate 18. Around each chip pad 38L, 38S there are located, in a prearranged pattern, a predetermined number of chip lead pads 40. In a preferred embodiment, each chip lead pad is substantially a 0.35 × 0.4 mm rectangle. Around large pads 38L there are 40 chip lead pads 40, 10 on each side and 24 around each of the smaller chip pads 38S, six on each side. In FIG. 6, because of the scale of the drawing, blocks 41L and 41S outline the areas on surface 36 within which chip pads 38L and 38S respectively and their associated chip lead pads 40 are located. In FIG. 7, the position of chip lead pads 40 with respect to a chip pad 38S is illustrated. The relationships of the chip lead pads 40 to a larger chip pad 38L, which is not illustrated, is similar to that for a small chip pad 38S except that there are 10 chip lead pads 40 in four lines each of which is substantially parallel to a side of each chip pad 38L.

A plurality of bores 42 are formed in the lower pin alignment plate 24. Each bore 42 has a substantially equal circular cross-section and, thus, has a center, the centers of each of the bores 42 are positioned on plate 24 so that they are substantially identical, or congruent, with the centers of chip pads 38L, 38S of multilayer substrate 18. Similarly, a plurality of circular bores 44, each having a center and each having substantially equal diameters, are formed in upper pin alignment plate 28. In the preferred embodiment, the diameter of the bores 44 are greater than the diameters of bores 42 in the lower pin alignment plate 24. When force structure 14 is properly positioned on its base 12, lower pin alignment plate 24 and upper pin alignment 28 are substantially parallel to one another and to base 12. If a multilayer substrate 18 is properly positioned in or oriented with respect to base 12 with base 12 being substantially horizontal, the centers of chip pads 38L, 38S and the centers of corresponding bores or openings 42, 44 of the upper and lower pin alignment plates 24, 28 will lie in a substantially straight vertical line.

A plurality of force pins 46 are positioned in the openings 42, 44 of force structure 14 for limited reciprocal linear movement therein. Each force pin 46 is a cylinder having a longitudinal axis 48 which is also its axis of symmetry and, in a preferred embodiment, weighs 15 grams. The lower portion 50 of each pin 46 is of a reduced diameter to slidably fit in the bores 42 formed in the lower pin alignment plate 24. At the bottom of each pin 46 a tip, or projection, 52 is formed which is symmetric with respect to the longitudinal axis 48 of each force pin 46. Shoulder 54 of each force pin 46 limits the downward movement of each force pin 46 as can be seen in FIG. 2. Upward movement, parallel to the longitudinal axis of a force pin, or movement of a force pin toward back plate 32 is stopped, or limited, by the upper end of a force pin 46 striking or contacting back plate 32.

Figure 5:
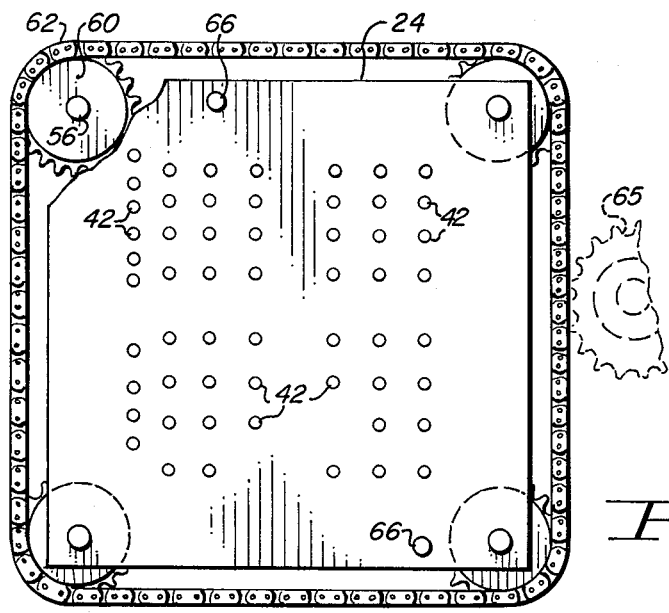
FIG. 5 is a bottom view of the force structure of FIG. 1.

Force structure 14 is provided with a plurality of lead screws 56 which are threaded through a threaded bore 58 in the lower pin alignment plate 24. In a preferred embodiment, force structure 14 is provided with four lead screws 56, one at each corner of lower pin alignment plate 24, and each of the four lead screws 56 has the same diameter and thread pitch. Each lead screw 58 has a sprocket 60 and a knurled head 62 bonded to it. A continuous chain loop 64 fits on teeth of the sprockets 60. Each of the sprockets 60 is of substantially the same size, so that rotation of one lead screw 56 causes all four of them to rotate together. Rotation of the lead screws 56 can be caused by twisting one of the knurled heads 62 or, as indicated in phantom in FIG. 5, by rotating drive sprocket 65 to engage chain 64. Power can be applied to drive sprocket 65 by hand, or from any suitable source such as a compressed air or electric motor, neither of which are illustrated since they are conventional.

To properly align force structure 14 with base 12, force structure 14 is provided with a pair of alignment pins 66, and base 12 is provided with a pair of alignment bores 68 within which pins 66 slidably fit. Alignment pins 66 and bores 68 are placed so that there is only one orientation of force structure 14 with respect to base 12 in which pins 66 will fit within alignment bores 68.

Each multilayer substrate 18 has a large number, from 50 to 100, in a preferred example, of IC chips 70L or 70S soldered to chip pads 38L, 38S. Each chip 70 has a number of flexible beam leads 72, up to forty for a large chip and up to twenty-four for a small chip. Each beam lead 72 has its inner end bonded to an electrical terminal or contact 74 which terminals are generally arranged around the perimeters of each chip, with up to six such terminals arranged in substantially straight lines parallel to the edges of chip 70S and uniformly spaced from the nearer edge as illustrated in FIG. 7. The outer end of each lead 72 is to be soldered to a chip lead pad 40. Before IC chips 70 and their leads 72 are placed on a substrate 18, a layer of solder is applied by a silk screen process, in one embodiment, to each of the pads 38L, 38S and 40. Substrate 18 is heated to liquify the solder. After cooling and prior to the chips 70L, 70S being placed on their respective pads 38L, 38S with their flexible beam leads 72 properly positioned with respect to chip lead pads 40, the surfaces of all of the pads are coated with a suitable flux. In a preferred example, the flux is a pure water-white rosin flux, manufactured by Alpha Metals Inc., which is sold under the trade name 5002 Microflux. This rosin flux is a sticky, clear liquid at normal ambient temperatures. Then the IC chips 70 and their leads are excised from segments of film, the leads are formed, and the chips and their leads are placed on the proper chip pads 38L, 38S of substrate 18 an operation that can be done by hand.

Each chip 70L, 70S and its leads 72 are initially held in place on substrate 18 by the adhesive characteristics of the flux. The resilience of the flexible beam lead 72, the light weight of a chip, the relative unevenness of the surfaces of the chip pads and chip lead pads, particularly after being presoldered, is such that not all of the outer ends of leads 72 of each chip normally will be in contact with their respective chip lead pads 40. Generally the back metal layer with which each of the chips 70L, 70S are provided to facilitate the soldering of a chip to its chip pad are not in significant contact with the surface of its chip pad.

To minimize the risk of a chip and its leads moving out of alignment with its chip lead pads, the substrate with its chips properly positioned with respect to the chip and chip lead pads is subjected to heating to melt the solder on the pads. This results in at least some of the leads of each chip being soldered to their chip lead pads. Preferred apparatus for applying heat to a substrate to reflow the solder, is a moving belt heater having three heating zones maintained at different temperatures. A suitable heater for this purpose is manufactured by the Browne Corporation of Santa Barbara, Calif., which heater is sold under the trade name Browne AR-7.

After a substrate 18 has cooled, and at least some of the leads of each of the chips 70L, 70S are soldered to their chip lead pads, the substrate is placed within the aperture 16 of base 12 with the corner of the substrate 18 bearing orientation marks 22 being placed in the corner of base 12 having reference mark 20 so that the force pins 46 of the force structure 14 when placed on base 12 will be aligned with the center of the chip pads of the substrate and the center of the chip placed in the chip pads. The force structure 14 is then placed on the base 12 with alignment pins 66 slidably fitting into the alignment holes 68. However, prior to force structure 14 being placed on the base 12, lead screws 56 are rotated so that they project a sufficient distance below the bottom surface of the lower pin alignment plate 24 so that the shoulders 54 of each of the force pins 46 will contact the upper surface of plate 24 and the tips 52 of each pin 46 will not contact a chip 70 positioned on a chip pad of substrate 18 when the force structure is initially placed on the base 12. Lead screws 56 are then turned, or rotated, to reduce gradually the distance between the lower pin alignment plate 24 and the base 12 until the tips 52 of each force pin 46 contact approximately the centers of the upper surfaces of each of the chips 70L, 70S positioned on the substrate and continue to be turned until the weight of each pin 46 is applied to each chip positioned on the substrate.

Base 12, with substrate 18 positioned in it, with force structure 14 mounted on base 12, and with the weight of a force pin 46 applied to each of the chips 70L, 70S is then put on a moving belt heater to liquify, or melt, the solder, to solder all the leads of each chip to their respective chip lead pads and to solder the back metal layer of each chip to its chip pad. Once the solder wets the leads and back plate of each IC chip, force structure 14 is raised by rotation of lead screws 56 either by applying a twisting force to a knurled head 62 or by applying suitable force to chain 64 either by hand or by drive sprocket 65 until the weight of the force pins 46 is removed from each IC chip 70L, 70S. The reason for doing this is to avoid squeezing solder from between the back metal layer of each chip and its chip pad which solder could possibly cause an electrical short circuit. When the weight of the force pins 46 is removed from each of the chips 70, the capillary forces acting on the liquid solder cause most of the solder squeezed out from between such a chip and its chip pad to flow back between them, which does not adversely affect the solder joint between a chip and the pad to which it is soldered. After the force pins are removed from the chips 70, fixture 10 and the substrate 18 are allowed to cool until the solder has returned to its solid state. Thereafter, substrate 18 can be removed from fixture 10 since the batch reflow soldering of chips 70 to substrate 18 is complete.

Figure 8:
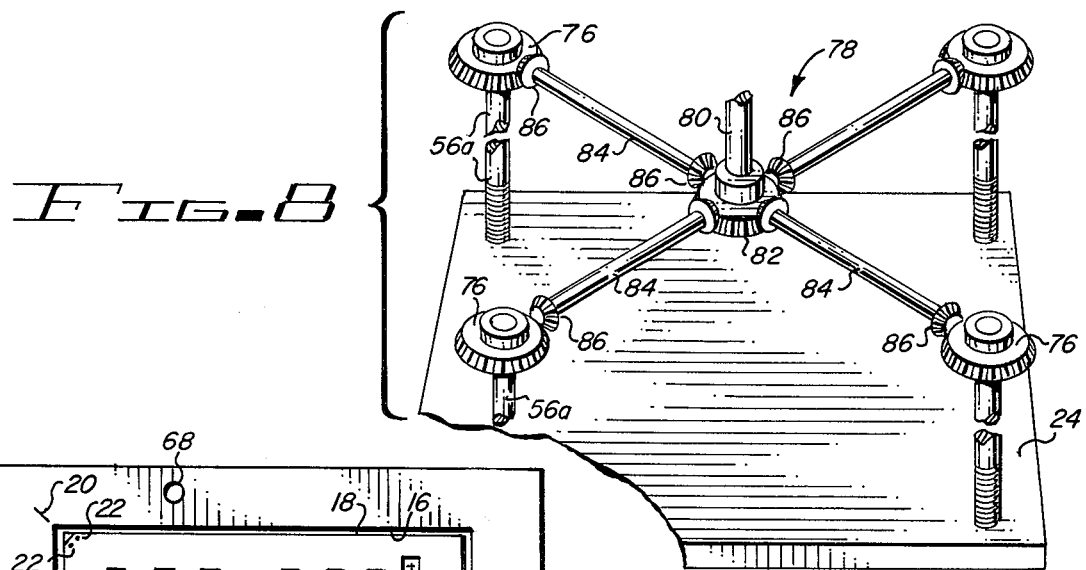
FIG. 8 is a schematic view illustrating another embodiment of the mechanism for varying the distance between the force structure and the base of the fixture.

In FIG. 8 a modification of the mechanism to raise and lower force structure 14 with respect to base 12 is schematically illustrated. Each of the lead screws 56a are extended so that they project above the top surface of back plate 32. Each of the lead screws 56a has a bevel gear 76 bonded to its upper end. All of the lead screws 56a are caused to rotate together by gear train 78 which includes drive shaft 80, a second bevel gear 82 which is connected by shafts 84 to the bevel gears 76 of each lead screw 56a by pinion gears 86 secured at each end of each shaft 84.

The number of pin alignment plates 24, 28 having different arrangements or patterns of openings 42, 44 within which force pins 46 move reciprocally, depends on the number of different arrangements of patterns or locations of chip pads 38 on a substrate 18. The actual number of different patterns is a compromise between the desire to have as few such patterns as possible to reduce manufacturing cost and complexity and the desire to optimize the electrical performance of each substrate. As a result, a plurality of force structures, one for each different pattern of chip pads on a multilayer substrate, is required in an actual production environment. The comission of a chip from a given chip pad does not create a new pattern since in such instances the force pin 46 that would be aligned with the center of such a chip pad, can be omitted from force structure 14.

From the foregoing it is apparent that applicant has provided a fixture that applies appropriate force to all the chips to be soldered on a multilayer substrate without dislocating the chips so that they can be soldered to a substrate in a single reflow soldering operation. As a result, the time required to solder IC chips to a multilayer substrate is significantly reduced, which reduces the cost while at the same time produces a significantly higher quality product.

It should be evident that various modifications can be made to the described embodiments without departing from the scope of the present invention.

What is claimed is:

1. A fixture for use in batch soldering integrated circuit chips to a substantially rectangular multilayer substrate, said substrate having a top surface,
a plurality of chip pads on the top surface of the substrate said chip pads having a predetermined location on the top surface, each chip pad having a center,
a plurality of chip lead pads surrounding each chip pad on the top surface of the substrate, the position of the chip lead pads with respect to a chip pad being predetermined;
integrated circuit chips having a bottom and top surface, the top surface having a center, the bottom surface of each integrated circuit chip having attached to it a back metal layer,
a plurality of flexible beam leads, one end of each beam lead being bonded to an electrical contact on the top surface of each chip, said chips being positioned on the substrate so that the back metal layer is substantially directly above a chip pad and so that the beam leads of each chip are above corresponding chip lead pads; said fixture comprising:
a base, a rectangular aperture in said base, the dimensions of the aperture being such that a multilayer substrate fits within the aperture; and
a force structure having force pin alignment means,
a plurality of force pins mounted for limited linear reciprocal movement in the pin alignment means, a tip formed at the bottom of each force pin;
means for aligning the force structure with the base comprising a pair of alignment bores formed in one and a pair of alignment pins mounted on the other, said bores and pins being positioned so that when the alignment pins are inserted into the alignment bores, the tips of the force pins are substantially aligned with the centers of chips positioned on chip pads of a substrate positioned in the base, and
means for varying the distance between the force structure and the base so that the weight of the force pins can be gradually applied to and removed from the chips positioned on chips pads of a substrate placed in said base.

2. The fixture of claim 1 in which the means for varying the distance between the base and the force structure are a plurality of lead screws mounted on the force structure and means for causing the lead screws to rotate together.

3. The fixture of claim 2 in which the number of lead screws is at least three, and the means for causing the lead screws to rotate together is a sprocket bonded to each lead screw and a chain loop engaging each sprocket.

4. The fixture of claim 2 in which the means for causing the lead screws to rotate together is a gear train.

5. A fixture for use in batch soldering integrated circuit chips to a multilayer substrate;

said substrate having a top surface;
a plurality of chip pads on the top surface of the substrate, said chip pads having centers, and each chip pad having a predetermined location on the surface;
a plurality of chip lead pads surrounding each chip pad on the top surface of the substrate; the position of the chip lead pads with respect to a chip pad being predetermined;
a layer of solder substantially covering each of said pads;
a layer of solder flux substantially covering the solder on each of said pads;
integrated circuit chips having a bottom and top surface, the bottom surface being a back metal layer and the top surface having a plurality of electrical contacts,
a plurality of flexible beam leads, one end of each beam lead being bonded to an electrical contact on the top surface of each chip, said chips being positioned on the substrate so that the back metal layer is substantially above a chip pad and so that the beam leads of each chip are above corresponding chip lead pads; said fixture comprising:
a base, an aperture in said base, the dimensions of the aperture being substantially equal to the dimensions of a multilayer substrate, and
a force structure, said force sturcture comprising; a lower and an upper force pin alignment plate, means forming a plurality of force pin openings through the force pin alignment plates, the center of said openings substantially corresponding to the centers of chip pads of a multilayer substrate;
means rigidly spacing the pin alignment plates a predetermined distance apart and so that the centers of corresponding force pin openings are aligned,
a plurality of force pins mounted for limited reciprocal movement with respect to the alignment plates in the force pin openings, each pin having a projection at its bottom end,
a pair of alignment bores formed in the base, a pair of alignment pins mounted on the lower pin alignment plate, said alignment pins adapted to slidably fit into the alignment bores to align the force structure with the base so that the projections of the force pins in the force pin openings of the alignment plates are substantially aligned with the centers of chips placed on the chip pads of a substrate positioned in the base, and
means for varying the distance between the base and the force structure so that the weight of the force pins can be gradually applied to and removed from chips positioned on chip pads of a substrate placed in said base.

6. The fixture of claim 5 in which the means for varying the distance between the base and the force structure are a plurality of lead screws threaded through the lower pin alignment plate and means for causing the lead screws to rotate together.

7. The fixture of claim 6 in which the number of lead screws is four and the means for causing the lead screws to rotate together is a sprocket bonded to each lead screw and a chain loop engaging each sprocket.

8. The fixture of claim 6 in which the means for causing the lead screws to rotate together is a gear train.

* * * * *